(12) United States Patent
Mazure et al.

(10) Patent No.: US 8,432,216 B2
(45) Date of Patent: Apr. 30, 2013

(54) DATA-PATH CELL ON AN SEOI SUBSTRATE WITH A BACK CONTROL GATE BENEATH THE INSULATING LAYER

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 1 day.

(21) Appl. No.: 13/007,483

(22) Filed: Jan. 14, 2011

(65) Prior Publication Data

US 2011/0215860 A1 Sep. 8, 2011

(30) Foreign Application Priority Data

Mar. 3, 2010 (FR) ...................................... 10 51526

(51) Int. Cl.
*G05F 1/10* (2006.01)
*H01L 27/105* (2006.01)
*G06F 17/50* (2006.01)

(52) U.S. Cl.
USPC .................... 327/537; 257/365; 257/E27.081

(58) Field of Classification Search ........................ None
See application file for complete search history.

(56) References Cited

U.S. PATENT DOCUMENTS

| 4,169,233 | A |   | 9/1979  | Haraszti .......................... 307/355 |
| 5,028,810 | A |   | 7/1991  | Castro et al. .................... 307/201 |
| 5,306,530 | A |   | 4/1994  | Strongin et al. ................ 427/533 |
| 5,325,054 | A |   | 6/1994  | Houston .......................... 324/158 |
| 5,455,791 | A |   | 10/1995 | Zaleski et al. .............. 365/185.26 |
| 5,557,231 | A |   | 9/1996  | Yamaguchi et al. ........... 327/534 |
| 5,608,223 | A |   | 3/1997  | Hirokawa et al. ......... 250/447.11 |
| 5,646,900 | A |   | 7/1997  | Tsukude et al. ............... 365/205 |
| 5,753,923 | A |   | 5/1998  | Mera et al. .................. 250/443.1 |
| 5,844,845 | A |   | 12/1998 | Tahara ....................... 365/189.05 |
| 5,869,872 | A |   | 2/1999  | Asai et al. ...................... 257/360 |
| 5,889,293 | A |   | 3/1999  | Rutten et al. .................... 257/74 |
| 5,982,004 | A | * | 11/1999 | Sin et al. ........................ 257/347 |

(Continued)

FOREIGN PATENT DOCUMENTS

EP   1 081 748 A2   3/2001
EP   1 095 407 A1   5/2001

(Continued)

OTHER PUBLICATIONS

International Search Report, PCT/EP2011/052413 mailed May 26, 2011.

(Continued)

*Primary Examiner* — Crystal L Hammond
(74) *Attorney, Agent, or Firm* — Winston & Strawn LLP

(57) ABSTRACT

The invention provides a data-path cell specifically adapted to its environment for use in an integrated circuit produced on a semiconductor-on-insulator (SeOI) substrate. The data-path cell includes an array of field-effect transistors, each transistor having a source region, a drain region and a channel region formed in the thin semiconductor layer of the SeOI substrate, and further having a front gate control region formed above the channel region. In particular, one or more transistors of the data-path cell further includes a back gate control region formed in the bulk substrate beneath the channel region and configured so as to modify the performance characteristics of the transistor in dependence on its state of bias. Also, an integrated circuit including one or more of the data-path cells and methods for designing or driving these data-path cells.

17 Claims, 4 Drawing Sheets

U.S. PATENT DOCUMENTS

| | | | |
|---|---|---|---|
| 6,043,536 A | 3/2000 | Numata et al. | 257/347 |
| 6,063,686 A | 5/2000 | Masuda et al. | 438/406 |
| 6,072,217 A * | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 * | 9/2006 | Liang et al. | 326/81 |
| 7,447,104 B2 | 11/2008 | Leung | |
| 7,449,922 B1 | 11/2008 | Ricavy | 327/57 |
| 7,986,167 B2 * | 7/2011 | Kapoor | 326/121 |
| 2001/0038299 A1 | 11/2001 | Afghahi et al. | 326/86 |
| 2001/0047506 A1 | 11/2001 | Houston | 716/4 |
| 2002/0052069 A1* | 5/2002 | Jiroku et al. | 438/166 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1* | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/154 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004303499 | 10/2004 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,553, filed Jun. 3, 2010.
U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/942,754, filed Nov. 9, 2010.
U.S. Appl. No. 12/961,293, filed Dec. 6, 2010.
U.S. Appl. No. 12/984,466, filed Jan. 4, 2011.
European Search Report Application No. EP 10 29 0217 dated Sep. 15, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns. Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.
R. Kaushik, et al. "Double-Gate SOI Devices for Low-Power and High-Performance Applications", IEEE Computer Society, The British Library, IEEE Xplore, 8 pages, (2006).
M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).
M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al."An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

U.S. Appl. No. 12/880,806, filed Sep. 13, 2010.
U.S. Appl. No. 12/898,230, filed Oct. 5, 2010.
U.S. Appl. No. 12/946,135, filed Nov. 15, 2010.
U.S. Appl. No. 12/974,916, filed Dec. 21, 2010.
U.S. Appl. No. 12/974,822, filed Dec. 21, 2010.
U.S. Appl. No. 13/039,167, filed Mar. 2, 2011.
European Search Report Application No. EP 09290838.3 dated Feb. 16, 2010.

K. Roy et al. "Double-Gate SOI Devices for Low-Power and High-Performance Applications", IEEE Computer Society, The British Library, IEEE Xplore, 8 pages, (2006).

M. Yamaoka, et al., "Dynamic-Vt Dual-Power-Supply SRAM Cell using D2G-SOI for Low-Power SoC Application," IEEE International Soi conference, Oct. 2004, pp. 109-111 (2004).

Ulicki, Bob et al., "De-Myth-tifying the SOI Floating Body Effect", SOI Industry Consortium, pp. 2-7 (2009).

European Search Report Application No. EP 10290181.6 dated Jan. 14, 2011.

U.S. Appl. No. 13/013,580, filed Jan. 25, 2011.

* cited by examiner

DATA-PATH CELL ON AN SEOI SUBSTRATE WITH A BACK CONTROL GATE BENEATH THE INSULATING LAYER

FIELD OF THE INVENTION

The field of the invention relates generally to microelectronic devices, and more particularly to a semiconductor device produced on an SeOI (semiconductor on insulator) substrate comprising data-path cells with enhanced performance characteristics.

BACKGROUND OF THE INVENTION

The design of integrated circuits is based on integrating a plurality of elementary cells (similar cells often being stored together in a cell library) having predetermined logic functions. In general, two types of design may be distinguished.

According to the first type of design, an integrated circuit is constructed by selecting and interconnecting individual cells from a library comprising a large number, e.g., about a thousand, predesigned cells having simple functions, e.g., primitive Boolean logic functions (e.g., NAND, NOR and the like) and basic storage functions (e.g., latches, flip-flops and the like). Such cells providing simple functions and having simple implementation are often referred to as "standard cells".

According to the second type of design, the cells are selected from a cell library providing cells specifically adapted to a particular circuit environment for which they are intended. Such cells providing more specialized functions and having more complex implementations are often referred to as "data-path" cells. Although data-path cells can be implemented by interconnecting standard cells, they are usually designed from scratch. In a given circuit, the use of data-path cells specifically developed for the environment of that particular circuit makes it possible to achieve better performance characteristics (typically in terms of speed, power consumption and footprint). However, the design cost is higher.

Thus, data-path cells are typically used only for high-speed circuits, for circuits requiring optimized performance characteristics, and the like. For example, microprocessors can be constructed from as an interconnected network of data-path cells. Often such a network is organized as one or more data-paths, which are typically linear arrangements of data-path cells that provide conduits for the flow and transformation of data. Data-path cells often found in a microprocessor include computational cells (e.g., multiplexers, shifters, adders, multipliers, and the like) and state elements (e.g., sequential circuits such as latches, register files and so like).

It is well known in the field of microelectronic devices, the field of application of the present invention, that improvements in performance (speed, power consumption and the like) and miniaturization are ongoing requirements. However, it is also well known that miniaturization can lead to problematic performance effects due to, e.g., short channel effects, small channel volume effects, and the like, and to problematic fabrication effects due to, e.g., irregularities in photolithography of highly miniaturized patterns.

Accordingly, there is a need in the art for data-path cells that overcome such problems of miniaturization and provide improved performance and size characteristics.

SUMMARY OF THE INVENTION

The present invention provides data-path cells, more specifically building blocks for data-path cells, that overcome miniaturization problems so as to provide improved performance and reduced size.

The invention relates to a data-path cell produced on a semiconductor-on-insulator substrate comprising a thin layer of semiconductor material separated from a bulk substrate by an insulating layer, the cell comprising an array of field-effect transistors (FETs). Each transistor comprises: in the thin layer of semiconductor material, a source region, a drain region and a channel region interposed between the source and drain regions, above the channel region, a front gate control region; and one or more back gate control regions formed in the bulk substrate beneath the channel region of one or more FETs. The back gate control region associated with a particular transistor is configured and positioned so that the performance characteristics of that transistor varies in dependence on a bias applied to the back gate control region. Also, the size and configuration of the FETs and the size and configuration of the back gate control regions are selected so that the data path cell is specifically adapted for use in the environment of a particular integrated circuit.

The cell advantageously includes a back gate line sized and configured so as to apply a bias to the back gate control regions of one or more selected FETs connected thereto. The back gate line generally extends into the bulk substrate beneath the insulating layer. Also, one or more of the back gate control regions may be isolated from the bulk substrate by a well of opposite conductivity. One or more of the back gate control regions may have a conductivity that is essentially the same as that of the channel region.

The channel regions, front control gate regions and back gate control regions of the one or more FETs are preferably sized and configured so that the associated FETs have a selected combination of reduced footprint and increased performance when compared to similar FETs without any back gate control regions. Furthermore, the channel regions and the front control gate regions of one of more of the FETs are sized such that so that the cell is specifically adapted for use in the environment of a particular integrated circuit.

These cells may include a plurality of back gate lines sized and configured so as to apply a bias to the back gate control regions of one or more FETs connected thereto, with each FET being connected to at most one back gate line. The array of FETs is conveniently arranged into one or more rows of FETs or into one or more columns of FETs, with the back gate line connected to the back gate control regions of the FETs along one of the rows or along one of the columns.

The array of FETs may further include an input stage including one or more FETs to which are connected input lines into the cell; and an output stage including one or more FETs to which are connected output lines from the cell, with the back gate line connected to the back gate control regions of the FETs of the input stage, or to the back gate control regions of the FETs of the output stage, or to the back gate control regions of the FETs of both the input and the output stages.

The invention also relates to an integrated circuit produced on a semiconductor-on-insulator substrate comprising one or more of the data-path cells described herein. The data-path cells may be arranged in one or more rows along a first direction, and when multiple rows are present at least one of the rows is arranged along a different second direction. The circuit may include one or more back gate control lines, with each back gate control line connecting the back gate control regions of some or all of the FETs in the data-path cells along one row. The data-path cells may be configured with input and output stages, with each stage comprising one or more FETs, and with one or more of the back gate control lines connected to the back gate control regions of FETs of input stages of the data-path cells along at least one row, or to back gate control regions of FETs of output stages of the data-path cells along at least one row.

The invention also relates to a method of driving the data-path cells described herein by applying two or more different bias voltages to the back gate control regions of one or more FETs, wherein at least one bias voltage is selected to reduce leakage currents, and at least one other bias voltage is selected to increase conduction currents. In this method, the back gate control regions of one or more FETs are advantageously biased to a first bias voltage when in the off-state, and wherein the back gate control regions of one or more FETs are biased to a different second bias voltage when in the on-state, with the at least one bias voltage selected to increase conduction currents applied to one or more FETs that provide output from the data-path cell.

The invention further relates to a method of designing the data-path cells described herein by specifically adapting the cell to an environment of a particular integrated circuit. This may be achieved by selecting the sizes of the channel regions and the front control gate regions of one of more of the FETs in order to achieve selected capacitance thereof; and providing the back gate control regions for one or more FETs in order to achieve selected conductance thereof when in an on-state, with the capacitance and the conductance selected in dependence on footprint and performance characteristics of the particular integrated circuit environment. In particular, the footprint and performance characteristics of the particular integrated circuit environment include one of a capacitance that is reduced by up to about 33% and conductance that is not reduced; an operating speed that is increased about 20% and a power consumption that is reduced about 20% in the active mode and by about one decade in the inactive mode, and wherein the footprint is reduced about 20%; and an operating speed that is increased between about 30 and 50%.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAILED DESCRIPTION OF THE PREFERRED EMBODIMENTS

In preferred embodiments, the invention provides data-path cells specifically adapted to particular environments, e.g., a microprocessor environment. The data-path cells of this invention are preferably formed in a semiconductor-on-insulator (SeOI) substrate comprising a thin layer of semiconductor material separated from a bulk substrate by an insulating layer. Each cell comprises an array of field-effect transistors with source, drain, channel regions formed in the thin layer of the SeOI substrate (the channel region being bounded by the source and drain regions), and front control gate regions formed above the channel regions. More specifically, in the present invention, one or more of the transistors have back gate control regions that are formed in the bulk substrate beneath the channel region and that are able to modify the performance characteristics of the transistors in dependence on the bias voltages applied to the back gates.

Certain preferred, but non-limiting, features of the provided cells include the following:
  a back gate line that connects the back gate regions of a plurality of transistors;
  a back gate line that extends into the bulk substrate beneath the insulating layer along a row of transistors;
  a back gate region that is isolated from the bulk substrate by a well of opposite conductivity type; and
  a back gate region with a conductivity of the same (or of the opposite) type as that of the channel of the associated transistor.

Further preferred embodiments of the invention provide integrated circuits produced on a SeOI substrate and comprising one or more of the data-path cells of the invention.

Further preferred embodiments of the invention provide methods of driving data-path cells of the invention, in which the back gate region is biased to a first potential when the transistor is in the off-state (according to the front control gate) and is biased to a second potential when the transistor is in the on-state (according to the front control gate).

According to yet another aspect, the invention relates to a method of designing a data-path cell in which the cell is specifically adapted to its environment for use in an integrated circuit produced on a semiconductor-on-insulator substrate comprising a thin layer of semiconductor material separated from a bulk substrate by an insulating layer, comprising the steps consisting in:
  reducing the physical width of a transistor of the cell, in order to decrease the capacitance thereof; and
  adding a back control gate to the transistor, said gate being placed in the bulk substrate, in order to increase the conductance thereof when in use in an on-state.

Figure 4A:
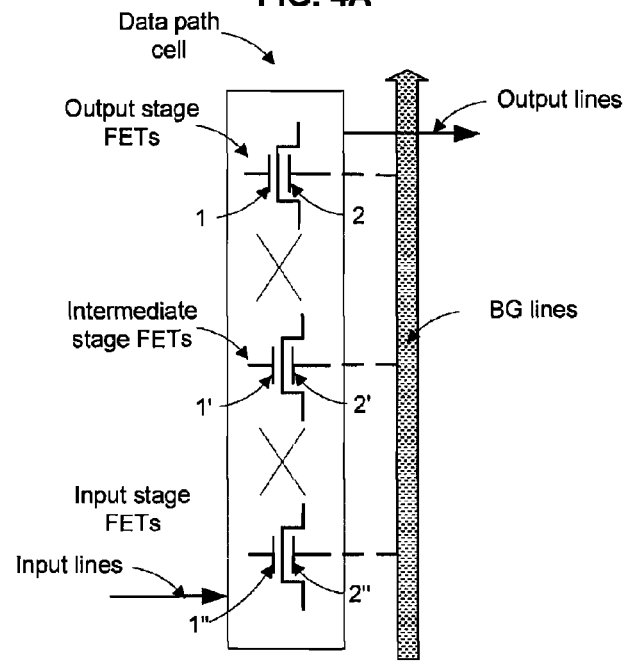
FIGS. 4A and 4B illustrate in a schematic fashion data-path cells and circuits including data-path cells.

Certain terms are used herein with the following definitions. The term "substantially" is used to mean a result that is complete except for the deficiencies normally expected in the art. Also, the description of a range is understood to also include description of all specific values within the described range The invention relates to data-path cells and to integrated circuits comprising one or more data-path cells. Each data-path cell is specifically developed for a particular circuit or circuit environment (e.g., for microprocessors) and is consequently highly adapted to its operating environment. Typically, a data-path cell comprises an input stage and an output stage. It may also include one or more intermediate stages connecting the input stage to the output stage. In a particular integrated circuit comprising data-path cells, the cells are often arranged in a regular spatial manner so that the cells and the associated FETs can be considered as an array of cells or of FETs FIG. 4A illustrates an exemplary CMOS data-path cell of the invention. The illustrated cell includes input stage FETs (field effect transistor) which receive input lines from, e.g., preceding data-path cells in a data-path. The FETs are illustrated with conventional symbols, where 1, 1' and 1" are front control gates (also referred to as gates). The illustrated cell also includes output stage FETs which provide output lines to, e.g., following data-path cells in a data-path. Finally, the illustrated data-path cell also includes intermediate stage FETs which are interconnected with the input and output stages and perform the prescribed processing functions of the data-path cell. In other embodiments, intermediate stage FETs are not present, and the input and output stage FETs are directly interconnected.

To maximize the speed of such a data-path cell, or indeed of virtually any CMOS circuit, various design maneuvers are possible. According to a first design maneuver, the length of the electrical connections connecting the data-path cells together or the length of the electrical connections connecting the stages of a data-path cell together can be shortened. The connections then have reduced capacitance resistance.

According to another design maneuver, output stages may be provided that have low output impedances. Such output stages then have a high level of conduction for rapidly charging the output electrical connection or connections and the input stage or stages of the following data-path cell. This latter maneuver typically requires the use of large transistors, particularly transistors having a large width because conduction is often proportional to transistor width. However, it should be noted that the capacitance of an output stage constitutes a load (for the input stage or the intermediate stage(s) of the data-path cell) which is higher the larger the dimensions of the transistors that make up the output stage, because capacity is often proportional to transistor size. Furthermore, the power consumptions of larger transistors, under both static and dynamic conditions, is larger, because power consumption is proportional to dimensions.

According to another design maneuver, input stages may be provided that have low-capacity. This may be achieved by reducing the dimensions of the FETs of the input stage of a cell. The load of the preceding cell is thus reduced. But by reducing the dimensions, there is a risk of this input stage not having a sufficient level of conduction for effectively charging the intermediate stage (if present) or the output stage. Moreover, performance variability may result from excessive miniaturization. In particular, then there is then a risk of parallel data-path cells having substantially different speeds.

Generally, any stage constitutes both an output to the following stage or following cell and an stage from the preceding stage or preceding cell. Therefore, for each stage, a compromise must be sought between transistors of small dimensions, in order to reduce the capacitance thereof (and therefore reduce the load of the preceding stage or stages) and transistors of large dimensions in order to reduce the resistance thereof (and therefore to charge the following stage or stages effectively).

In this invention, each of the stages of a data-path cell will typically include FET transistors that are produced on an SeOI substrate, especially on an SOI (silicon on insulator) substrate. As is conventional, each FET transistor typically has a source region, a drain region, a channel region which separates the source region from the drain region, and a front control gate separated from the channel by a gate dielectric layer.

Then, this invention provides back control gates for one or more of these FET transistors. The back control gates are positioned in the bulk of the SeOI substrate (i.e., below the buried oxide layer) facing the channels of the associated transistors.

Further, this invention provides back gate lines connecting one or more back control gates. The back gate lines are preferably structured with respect to the data-path cells so that the associated cells if the invention can be appropriately controlled, e.g., the input stage FETs begin controlled to optimize the properties of the input stages, while the output stage FETs begin separately controlled to optimize the different properties of the output stages (and, optionally, the intermediate state FETs being separately controlled).

Returning to FIG. 4A, the illustrated FETs of the data-path cell also have back control gates 2, 2' and 2". All though all illustrated FETs here have back control gates, alternatively not all FETs have back control gates, e.g., only one or a few of the FETs of the data-path cell can have back gates. These back control gates are also illustrated as individually connected to back control gate lines (BG lines) which lead externally from the data-path cell. The back gate lines can also interconnect the back gates of FETs within the cell in various manners. For example, some or all of the back gates of the input stage can be connected together, as can the back gates of the intermediate and output stages.

The stippled arrow external to the cell represents that the back control gates can be externally connected in numerous manners. For example, all the back control gates of one data-path cell can be connected together to one or more external lines; or the back gates of the input, intermediate, and output stages can be separately connected to individual external lines, or the back gates of individual FETs can be connected to individual external lines. These external lines can then interconnect the back control gates of two or more data-path cells in various manners. For example, the back control gates of the input stages of a group of cells can be connected together, as can the back gates of the intermediate and output stages of this group of data-path cells.

In short, it will be apparent that the back control gate of an array of FETs, whether the FETs are arranged as part of one or more data-path cells or whether the FETs are individually arranged, can be connected together so that the FETs array can be specifically adapted to a particular circuit environment for use in a particular integrated circuit.

Accordingly, the data-path cells in a particular integrated circuit of this invention, which as described can often be considered as a spatial array of FETs, can be specifically adapted both to a particular environment within the integrated circuit and also, to the particular integrated circuit environment in general.

In the following, back control gates and the control of the associated transistors by back control gate are first described. Following this, data-path cells and data-paths including back control dates and their control by their back control gates are described.

Figure 2:
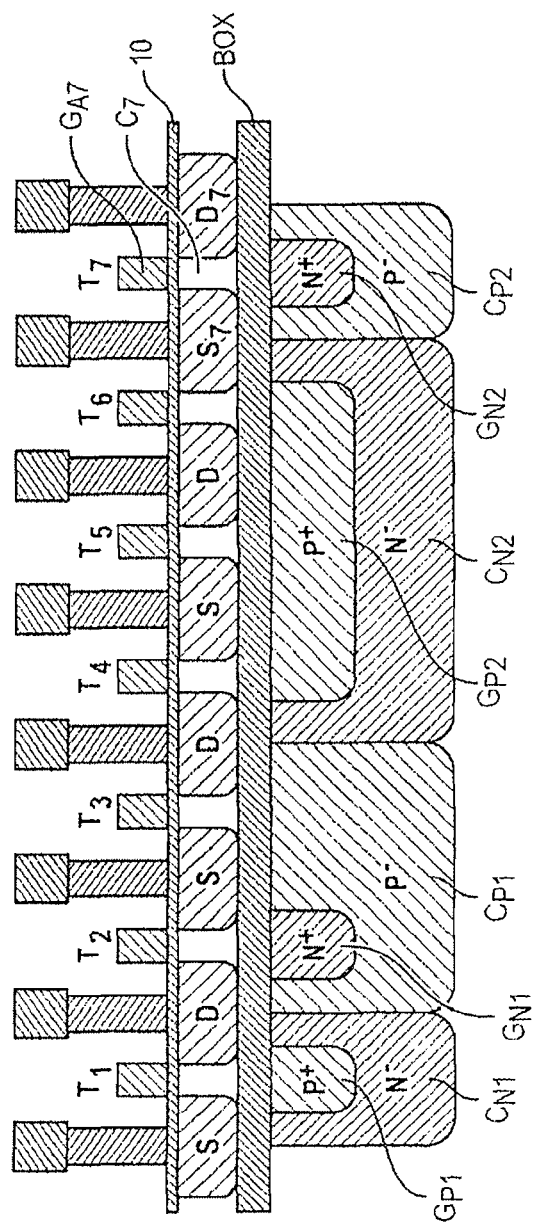
FIG. 2 illustrates possible structures of several back control gates of the invention.

Thus, turning specifically to back control gates, FIG. 2 is an exemplary illustration of a row of nMOS transistors $T_1$-$T_7$ produced on an SeOI substrate according to this invention. For the sake of clarity only, these transistors have the same dimensions. In this sectional view, the insulating layer bears the reference BOX (buried oxide). The source, drain and channel regions are within the thin semiconductor layer above the insulating layer BOX, and the front control gates are above the channel regions separated therefrom by a gate dielectric layer.

In this figure, the channels of the transistors are fully depleted, the source regions S and the drain regions D both being in contact with the insulating layer BOX. However, the invention also extends to partially depleted technology in which the source region and the drain region do not extend right into the thin layer. In this case, it should be noted that the back control gate is overall less effective in controlling such an FET as it is spaced further from the channel region between the source and drain regions.

FIG. 2 is not limiting, and in practice, the transistors of the data-path cell are not necessarily arranged in rows; they do not necessarily have the same dimensions (including along a given row); they may have an individual back control gate or a common back control gate; the potential applied to the back control gates may or may not be different; etc.

Referring to the transistor $T_7$, this transistor has, in the thin layer of the SeOI substrate, a source region $S_7$, a drain region $D_7$ and a channel region $C_7$ lying between the source and the drain. The transistor $T_7$ further includes a (first) front control gate region $G_{A7}$ conventionally placed in a manner known per se above the channel, a gate dielectric layer 10 being interposed between the front control gate $G_{A7}$ and the channel $C_7$.

The transistor $T_7$ further includes a second gate, namely, back control gate $G_{N2}$, placed in the bulk substrate and separated from the channel $C_7$ by the insulating layer BOX. The back control gate $G_{N2}$ can be used for, e.g., increasing the conduction of the transistor without having to increase the dimensions thereof. The back control gate can be, for example, formed by implanting dopants beneath the insulating layer BOX.

FIG. 2 illustrates some of the variations that are within the scope of this invention. In FIG. 2:
- the transistor $T_1$ has a back control gate $G_{P1}$ of p$^+$-type;
- the transistor $T_2$ has a back control gate $G_{N1}$ of n$^+$-type;
- the transistor $T_3$ has no back control gate;
- the transistors $T_4$-$T_6$ have a common back control gate $G_{P2}$ of p$^+$-type; and
- the transistor $T_7$ has a back control gate $G_{N2}$ of n$^+$-type.

FIG. 2 illustrates that a back control gate can be associated individually with a particular transistor, in which case it can be located in the bulk substrate beneath the insulating layer so as to extend only facing the channel of the associated transistor (cf. transistors $T_1$, $T_2$ and $T_7$). Alternatively, a back control gate may be common to a plurality of transistors. Such a common back control gate can lie in the bulk substrate beneath the insulating layer under the channels of said plurality of transistors (in the case of the transistors $T_4$-$T_6$).

Back control gates are preferably isolated from the bulk substrate by a well, e.g., $C_{N1}$, $C_{P1}$, $C_{N2}$, $C_{P2}$, of opposite conductivity type (n-type well $C_{N1}$, $C_{N2}$ for a p$^+$-type back control gate $G_{P1}$, $G_{P2}$; p$^-$-type well $C_{P1}$, $C_{P2}$ for an n$^+$-type back control gate $G_{N1}$, $G_{N2}$). The well voltage is preferably chosen so that the parasitic diode created between the back control gate and the surrounding well is reverse-biased. If reverse-biased, such a diode isolates the back control gate from the well and its contents (especially other back control gates). Alternatively, a single well common to several back control gates of the same type can be provided.

As an alternative or in addition to the wells, a second insulating layer, based in the bulk substrate beneath the insulating layer BOX, may also contribute, completely or partly, to isolating a back control gate from the bulk substrate. As a further alternative or in addition to the wells, lateral isolation regions extending beneath the insulating layer BOX and depthwise into the bulk substrate can be provided so as to isolate the back control gate from the bulk substrate. In such a situation, the back control gate does not have to be precisely located facing the channel of a transistor.

By biasing the back control gate of a transistor positively or negatively (typically by +0.3 V or -0.3 V), the properties of the associated transistor may be individually modified. In particular, the threshold voltage of the transistor may be shifted or modified, which is, as well known, equivalent to modifying the physical width of the channel of the transistor. Thus, although the physical width of the channel of a transistor is defined once-for-all during fabrication, this invention makes it possible to modify the apparent (effective) width of such a channel by choosing the way in which the back control gate is biased or driven.

For example, a transistor with a channel of n-type conductivity and a back control gate of p-type conductivity (the back control gate is then said to have a work function or a larger work function) has a very high threshold voltage that can be lowered by applying a positive voltage to the back control gate. Also, a transistor having a channel of n-type conductivity and a back control gate of n-type conductivity (the back control gate is then said not to have a work function or a smaller work function) has a nominal threshold voltage that can be lowered by applying a positive voltage to the back control gate.

The variation in threshold voltage of the transistor due to variations in the bias voltage applied to the back control gate may be formulated according to $V_{th}=V_{t0}-\alpha V_{BG}$, where $V_{th}$ represents the threshold voltage of the transistor, $V_{BG}$ the (bias) voltage applied to the back control gate and $V_{t0}$ the nominal threshold voltage (which may be shifted by the work function according to whether a back control gate of n-type or p-type is used). The $\alpha$ a factor associated with the geometry of the transistor, and may be modeled as $\alpha=3t_{ox1}/(t_{Si}+3t_{ox2})$, where $t_{ox1}$ denotes the thickness of the dielectric layer of the gate separating the front control gate from the channel, $t_{ox2}$ denotes the thickness of the insulating layer separating the back control gate from the channel and $t_{Si}$ denotes the thickness of the thin semiconductor layer.

Summarizing, the type of doping of the back control gate associated with a transistor can or can not shift the nominal threshold voltage; also the bias of the back control gate can or can not shift the threshold voltage. Thus, transistors of this invention can have increased conduction current $I_{ON}$, in the on-state of the transistor (by reducing the threshold voltage), and reduced leakage current $I_{OFF}$ in the off-state of the transistor (by increasing the threshold voltage).

Accordingly, at a given technology node (e.g., the 45 nm technology node), the invention makes possible CMOS datapath cells formed on SeOI substrates having transistors with more advantageous characteristics, such as capacitance and conductance (considered individually or in combination), when compared with similar CMOS data-path cells formed on bulk substrates.

For example, this invention makes possible transistors (e.g., in given stage of a data-path cell) with smaller capacitances (e.g., because of their smaller sizes), which may therefore be charged more rapidly by preceding output transistors (e.g., by preceding stages of a data-path cell). Because transistor conductance can be increased by use of back control gates, such smaller transistors need not have the proportionately smaller conductance that might be expected because of their decreased sizes. This invention also makes possible transistors (e.g., in given stage of a data-path cell) with larger conductances, which may therefore charge more rapidly succeeding input transistors (e.g., in succeeding stages of a data-path cell). Also, because transistor conductance can be increased by use of back control gates as well as by increased sizes, such larger-conductance transistors need not have the proportionately larger capacitance that might be expected if the larger conductance were due to larger size.

These advantages provided by the invention are already apparent at the 45-nm-lithography technology node. But they become even more apparent at finer technology nodes, e.g., the 32 nm node, because thickness ratios and voltages become more and more favorable to the invention at finer and finer technology nodes. Preferably, the invention is applied at least as the 45 nm technology node, and more preferably at finer technology nodes.

In more detail, concerning capacitance, the invention makes possible design and use of transistors (e.g., transistors in CMOS data-path cells formed on SeOI substrates with back control gates) having smaller physical widths smaller, and thus smaller capacitance, than the physical widths of transistors with similar conductance would have in the absence of the invention (e.g., transistors in CMOS data-path cells formed on bulk substrates and without back control gates), even though it is known that reducing transistor widths also reduces the conductance of the data-path-cell stage to which such a transistor belongs. For example, if the width of a transistor is reduced by a factor of up to about two, then the transistor's input capacitance is also reduced by an approximately similar factor. In such a way, the load of the preceding stage or stages of the data-path cell is reduced.

In more detail, concerning conductance, the invention makes possible design and use of transistors (e.g., transistors in CMOS data-path cells formed on SeOI substrates with back control gates) having conductance (conduction currents) larger than the conductance of similar transistors with similar widths would have in the absence of the invention (e.g., transistors in CMOS data-path cells formed on bulk substrates and without back control gates), even though it is known that increasing transistor conductance generally requires increasing transistor width and, therefore, capacitance. In other words, it is possible to reduce the resistance (increase the conductance) of the stage to which this transistor belongs so that the following stage or stages may be more effectively charged. Otherwise stated, back control gates generally make possible reductions of the widths of transistors without reducing the conductance of the transistor (starting from the 45 nm lithography).

In both cases, such increased conductance depends on properly biasing the back control gates of the associated transistors (the effective width of the channel is thus increased without the physical width being modified).

Reduced capacitances (due to reduced physical widths) and increased conductance (due to increased effective widths arising from properly biased back control gates) can be combined to achieve various effects. For example, this invention makes possible a reduction of the load (because of a reduced capacitance consequent to smaller widths) of a particular stage of a data-path cell as seen by a preceding stage of that cell by up to about 33% (and preferably at least 20%) with a constant level of conduction (because the conductance that would be reduced because of a smaller width can be increased by a properly-biases back control gate). In the absence of a back control gate, it is intuitively estimated and believed that only a quadratic factor ($\sqrt{2}$) of width reduction is usually preferable.

Alternately stated, this invention makes possible an impedance reduction (due to a capacitance reduction) of around 33% (and preferably at least 20%) at the 32 nm technology node in comparison to the 45 nm technology node without having to increase the relative size of the transistors (in order to preserve conductance). This reduction can be even greater for the next-generation technologies. Such an impedance reduction results from the smaller lithographic features; and relative transistor sizes need not be increased results because properly-biases back control gates can restore conductivity decreases that would be expected because of reduced sizes More generally, data-path cells are often optimized relative to their circuit context or intended environment. Accordingly, instead of exclusively optimizing the capacitance or the resistance (the inverse of the conductance), it can be desirable to optimize both together. In such situations, the footprint of the data-path cell may be reduced by up to about 25% (and preferably between 15% and 25% because of reduced sizes) while the conductivity can even be increased (by properly-biases back control gates).

The following equation, drawn from article "*Closed-form Expressions for Interconnection Delay, Coupling, and Crosstalk in VLSI's*" by T. Sakurai, in IEEE Transactions On Electron Devices, Vol. 40, No. 1, January 1993, illustrates the propagation delay $T_v$ between an output stage and an input stage:

$$T_v = 0.1\, R_{int}C_{int} + \ln\left(\frac{1}{1-v}\right)(R_{buf}C_{int} + R_{int}C_{buf} + R_{buf}C_{buf} + 0.4\, R_{int}C_{int}).$$

In this equation:

$R_{int}$ and $C_{int}$ represent the resistance and the capacitance, respectively, of the electrical connection between stages, these values varying depending on the lithography (32 nm in the example considered below) and on the length of the connection (between 10 nm and 10 µm in the example);

$R_{buf}$ represents the resistance (inverse of conductance) of the output stage at the entry of the electrical connection; and $C_{buf}$ represents the impedance (inverse of capacitance) of the input stage at the other end of the electrical connection.

Figure 1:
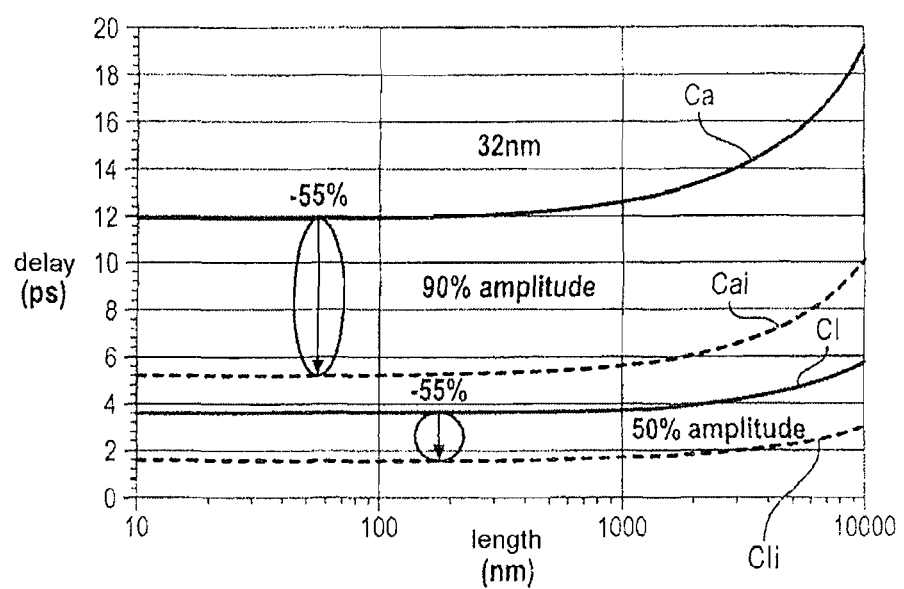
FIG. 1 illustrates propagation delay (in picoseconds (ps)) as a function of the connection length (in nm)

The curves Ca and Cl in FIG. 1 show the propagation delay (in picoseconds (ps)) as a function of the connection length (in nm), for propagation of 90% of the amplitude of an analogue signal and for 50% propagation of the amplitude of a digital signal, respectively.

As already described, it is possible to vary one or both of $C_{buf}$ and $R_{buf}$: $C_{buf}$ can be varied by a reduction in the dimensions of the transistor; and $R_{buf}$ can be varied by providing and properly biasing the back control gate. In one exemplary embodiment, $C_{buf}$ and $R_{buf}$ are reduced by 33%. Curves Cai and Cli in FIG. 1 illustrate the substantial reduction (by about 55%) in the propagation delay for the analogue and digital situations respectively in this embodiment.

At the 32 nm technology node, such reductions in propagation delay permit operating speeds to be up to about approximately doubled (more conservatively, to be increased by up to about 33% (and preferably between 25% to 33%)). At the same time, the footprint of the data-path cell may be reduced by up to about 25% (and preferably between 15% to 25%).

Also transistors of this invention can have reduced leakage currents and, therefore, also reduced power consumption (in comparison to similar transistors conventionally designed without back control gates and/or on bulk substrates). This reduction in leakage is due both to the use of smaller transistors and also to appropriately biasing the back control gate when the transistor is in the off-state (thereby, reducing the leakage current $I_{OFF}$). For example, the power consumption may thus be reduced by up to about 33% (and preferably between 25% to 33%) in the on-state, and can be reduced up to about one to two decades in the off-state in comparison to a similar data-path cell in conventional CMOS technology. Such reductions in power consumption generally occur at a constant operating frequency insofar as power consumption varies directly with switching speed (frequency).

Also transistors of this invention can operate at higher frequencies. It is well known that transistors with reduced size, or with higher conductance, or with both reduced size and higher conductance, such as the transistors of this invention, are capable of markedly faster operation. Thus, the transistors of this invention can operate at higher frequencies, and can do so without necessarily consuming more power (in comparison to similar transistors conventionally designed without back control gates and/or on bulk substrates). In this invention, higher frequency operation simply means a commensurately higher usage factor without necessarily higher power consumption. A conservative estimate of operating frequency increase is up to about 50% (and preferably between 30% to 50%).

The invention also provides methods of designing data-path cells, circuits including a plurality of data-path cells and other circuits including transistors of this invention. Concerning individual cells, for example, such methods make an appropriate compromise between driving the back control gate and the physical dimensions of the transistor. As has been already described, an appropriate compromise can achieve, simultaneously, both up to about 20% (preferably about 20%) reduction in the footprint and up to about 20% (preferably about 20%) increase in performance. Other compromises can achieve other combinations of reduced footprint and increased performance (e.g., combinations that only reduce footprint without signification changes in performance, or combinations that only increase performance without signification changes in footprint).

An exemplary cell according to the invention can have an operating speed up to about 20% (preferably at least about 20%) higher, has a footprint up to about 20% (preferably about 20%) lower and a power consumption reduced by up to about 20% (preferably about 20%) in the active mode and by more than one decade in the inactive mode.

Further, the design methods may provide in any particular data-path cell: back control gates for only one, some, or all of the transistors; one or more back gate lines connecting the back control gates of a plurality of transistors; a common back gate line connecting the back control gates of transistors placed along one and the same row (or column) in a particular circuit; and the like.

Figure 3:
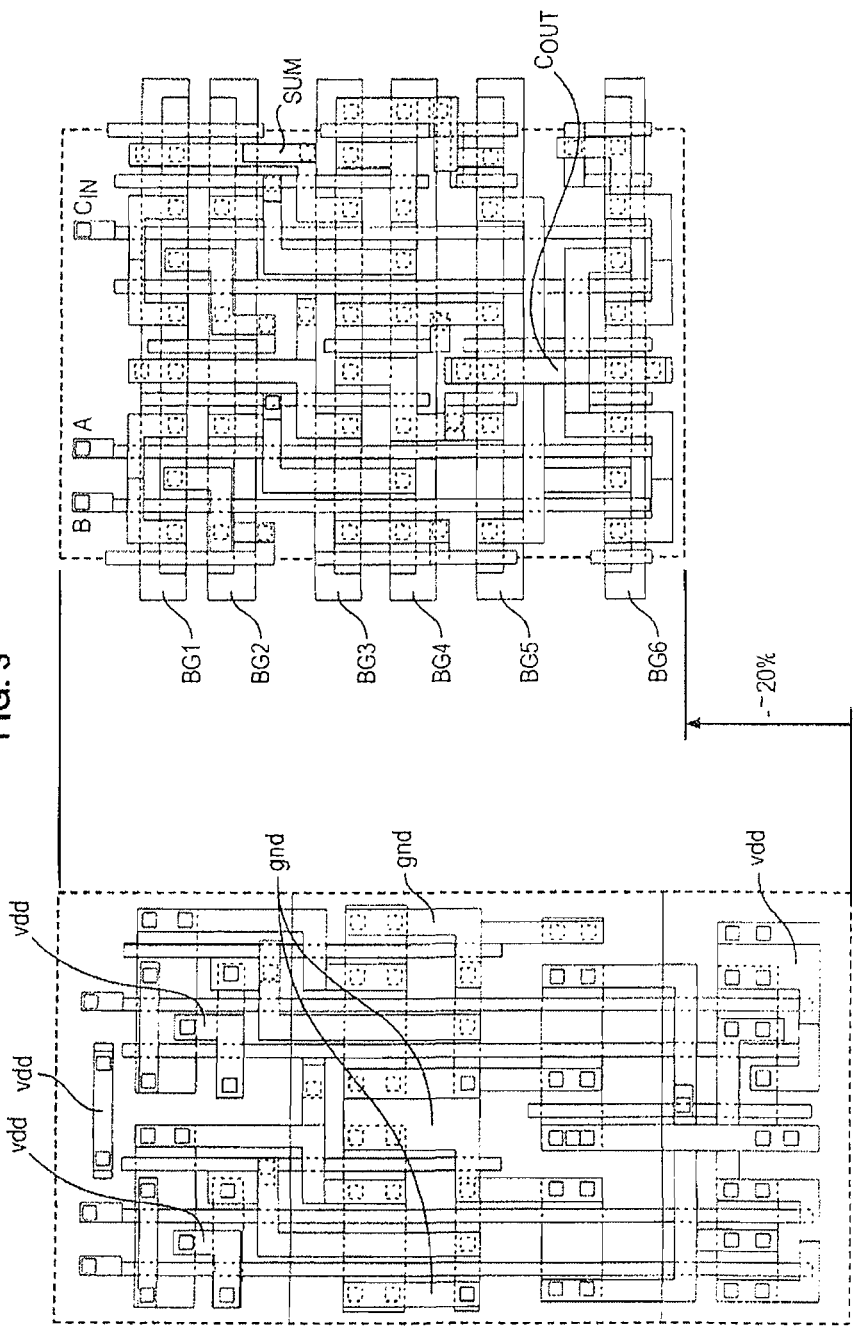
FIG. 3 compares a CMOS data-path cell on a bulk substrate with a CMOS data-path of the invention formed on a SeOI substrate.

FIG. 3 shows a comparison between a full-adder data-path cell designed for fabrication in bulk CMOS technology (on the left in FIG. 3) and the same cell designed for fabrication on an SeOI substrate according to the invention (on the right). The transistors of the cell according to the invention are arranged in rows, and back gate lines BG1-BG6 extend in the bulk substrate beneath the insulating layer along each row.

The exemplary cell of FIG. 3 is configured and structured so as to be advantageous for photolithography. First, it provides a regularized configuration for limiting the aberrations and deformations caused by reducing the dimensions under the wavelength of the light that exposes the photoresist masks. This regularized configuration is based especially on a single polysilicon orientation (giving only a single dimensional tolerance in relation to the fabrication tools) and on a single polysilicon pitch (giving better control of the optical phenomena).

Photolithography operations are further simplified because: cell comprises bands of active zones; and the transistors of any one row have the same dimensions (especially the same width). Even though the transistors have the same dimensions, each transistor (or each group of transistors, especially each row of transistors) may have an individually selected "scale factor" simply by applying a different potential to each back control gate. The design illustrated in FIG. 3 is not limiting, because the invention also covers transistors having different physical dimensions (particularly different widths) along any one row.

Figure 4B:
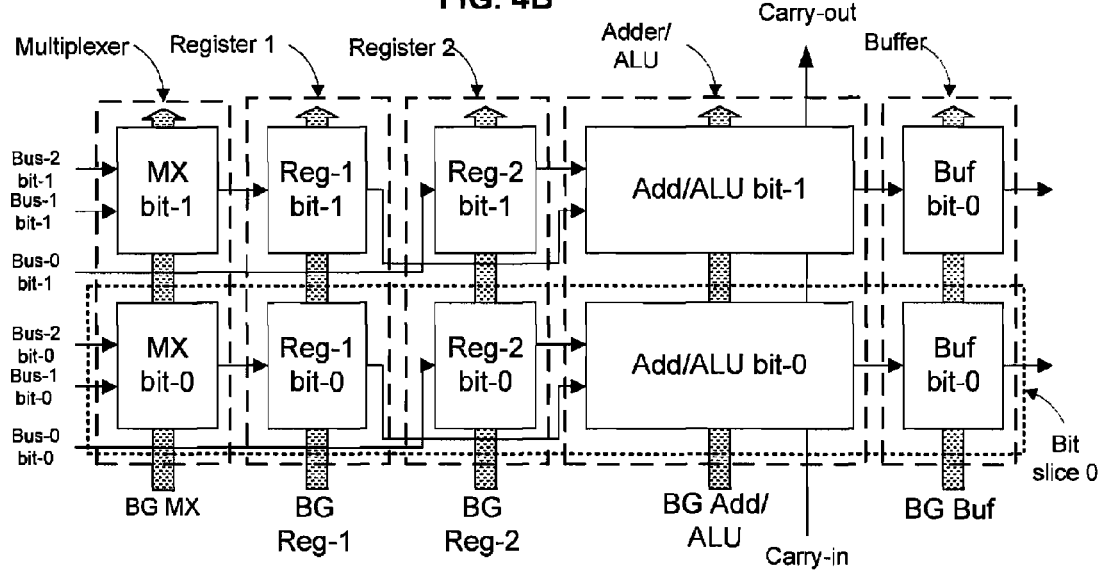

Concerning circuits including a plurality of data-path cells (and other circuits) including transistors of this invention, FIG. 4B illustrates an exemplary data-path, that is a circuit including a plurality of data-path cells. In the illustrated circuit, the data-path cells are arranged as a 2-bit wide data-path that might occur in a microprocessor. In this exemplary circuit, the multiplexer selects which of the input bus-1 or the input bus-2 is stored in register 1. Input of bus-0 is stored in register 2. The ALU processes the outputs of registers 1 and 2. The buffer stores and outputs the results of the processing by the ALU.

This circuit is arranged in an array-like fashion with two axes, conventionally taken as a horizontal axis and a vertical axis. Data-path cells performing similar processing of individual bits, e.g., multiplexing, storing (in registers), adding, and buffering, are arranged along one (the vertical) axis, and individual processing stages are arranged along the other (the horizontal) axis. Here, except for the ALU cells, data-path cells from the individual bits are substantially independent. Accordingly, data lines generally (in the manners expected in VLSI routing) run along the horizontal axis from the input, to a first data-path cell, to subsequent data-path cells, and to the output.

Some or all of the FETs of the individual data-path cells of FIG. 4B have back control gates connected to back gate control gate lines. It has already been described with reference to FIG. 4A that these back gate lines can interconnect the back gates within individual cells in various manners, and can also connect the back gates of individual cells to external lines in various manners. FIG. 4B now illustrates that external back gate lines can interconnect the back gates of separate data-path cells. In general, these external interconnections can be selected as necessary so that the plurality of data-path call can be specifically adapted to a particular circuit environment for use in a particular integrated circuit.

In a preferred embodiment, the back gates of data-path cells performing similar functions can be interconnected (e.g., along a column). Also, the back gates of the input (or of the intermediate or of the output) stages of multiple data-path cells (e.g., of data-path cells performing similar functions along a column) can be interconnected. In this embodiment, the result is the array-like arrangement then includes one or more back gate lines running along the vertical direction. The primarily vertical back gate lines and the primarily horizontal data lines mutually define a grid-like arrangement. The FETs then have an array-like arrangement disposed within this grid.

It will have been understood that the invention is not limited to a data-path cell according, but also extends to other embodiments providing integrated circuits comprising such cells, to methods of driving such cells, and to method of designing such cells in which the physical width of at least one transistor of the cell is reduced so as to decrease the capacitance thereof and a back control gate is added to the transistor in order to increase the conductance thereof.

The invention also provides methods of operating data-path cells having transistors with back control gates and methods of operating circuits containing data-path cells of this invention (and methods of operating other circuits having transistors of this invention with back gates). In general, these methods select the conductance of a transistor by varying the size of the potential or bias applied to its back control gate. This is equivalent to changing the effective width of the transistor so that the transistor can have an individually selected "scale factor."

In some embodiments, such methods include biasing one or more back control gates according to the functional role of the transistors in a circuit or data-path cell. In such methods, the applied bias typically remains substantially constant over a large number of cycles of circuit operation, or even substantially constant over longer periods of time. For example, for transistors in data-path cells, they include applying a first potential to certain output stage transistors so that they have increased conductance (decreased resistance) so that they can drive subsequent stages more rapidly. A second potential can be applied to certain other data-path cell transistors to reduce their leakage current in the absence of signals and so reduce their power consumption.

In other embodiments, such methods also include biasing one or more back control gates according to the current state of the transistor. In such methods, the applied bias typically varies every cycle, or every few cycles, of circuit operation. For example, they include applying a first potential to the back control gate when the transistor is in the off-state (according to the front control gate) and a second potential when the transistor is in the on-state (also according to the front control gate). More particularly, when the back control gate is in the low or off-state (e.g., by being connected to ground), the associated transistor has lower conductance and operates at low speed with low leakage, and in the absence of input signals, reduced power consumption. When the back control gate is in the high or on-state (e.g., by being connected to a nominal supply voltage $V_{DD}$) the transistor has higher conductance and operates at higher speeds.

In further more general embodiments, such methods include more generally applying different biases to the back gates of different transistors to either increase conductance or reduce leakage current to optimize their performance according to the particular roles in a circuit or in a circuit environment. Accordingly, these methods can adapt transistors specifically to their particular circuit environments in a particular integrated circuit. They require that the back control gates be appropriately interconnected with back gate lines.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A data-path cell produced on a semiconductor-on-insulator (SeOI) substrate comprising a thin layer of semiconductor material separated from a bulk substrate by an insulating layer, the cell comprising an array of field-effect transistors (FETs), each transistor comprising:
   within the thin layer of semiconductor material of the SeOI substrate, a source region, a drain region and a channel region interposed between the source and drain regions, and a front control gate above the channel region; and
   one or more back control gates formed within the bulk substrate of the SeOI substrate beneath the channel region of one or more FETs, with each back control gate associated with a particular transistor being configured and positioned so that the performance characteristics of that transistor varies in dependence on a bias applied to the back control gate,
   wherein the size and configuration of the FETs and the size and configuration of the back control gates are selected so that the data path cell is specifically adapted for use in the environment of a particular integrated circuit.

2. The cell of claim 1, further comprising a back gate line sized and configured so as to apply a bias to the back control gates of one or more selected FETs connected thereto, with the back gate line extending within the bulk substrate beneath the insulating layer.

3. The cell of claim 2, further comprising a plurality of back gate lines sized and configured so as to apply a bias to the back control gates of one or more FETs connected thereto, with each FET being connected to at most one back gate line.

4. The cell of claim 2, wherein the array of FETs is arranged into one or more rows of FETs or into one or more columns of FETs, and wherein the back gate line connects to the back control gates of the FETs along one of the rows or along one of the columns.

5. The cell of claim 2, wherein the array of FETs further comprises:
   an input stage including one or more FETs to which are connected input lines into the cell; and
   an output stage including one or more FETs to which are connected output lines from the cell, and
   wherein the back gate line connects to the back control gates of the FETs of the input stage, or to the back control gates of the FETs of the output stage, or to the back control gates of the FETs of both the input and the output stages.

6. The cell of claim 1, wherein one or more of the back control gates is isolated from the bulk substrate by a well of opposite conductivity.

7. The cell of claim 1, wherein one or more of the back control gates has a conductivity that is essentially the same as that of the channel region.

8. The cell of claim 1, wherein the channel regions, the front control gates and the back control gates of the one or more FETs are sized and configured so that the associated FETs have a selected combination of reduced footprint and increased performance when compared to similar FETs without any back control gates.

9. The cell of claim 1, wherein the channel regions and the front control gates of one of more of the FETs are sized such that so that the cell is specifically adapted for use in the environment of a particular integrated circuit.

10. An integrated circuit produced on a semiconductor-on-insulator substrate comprising one or more of the data-path cells of claim 1.

11. The circuit of claim 10, wherein the data-path cells are arranged in one or more rows along a first direction, and when multiple rows are present at least one of the rows is arranged along a different second direction.

12. The circuit of claim 11, further comprising one or more back gate control lines extending within the bulk substrate beneath the insulating layer, each back gate control line connecting the back control gates of some or all of the FETs in the data-path cells along one row.

13. The circuit of claim 12, wherein the data-path cells are configured with input and output stages, each stage comprising one or more FETs, and wherein one or more of the back gate control lines connects to the back control gates of FETs of input stages of the data-path cells along at least one row, or to back control gates of FETs of output stages of the data-path cells along at least one row.

14. A method of designing a data-path cell of claim 1 which comprises specifically adapting the cell to an environment of a particular integrated circuit by
   selecting the sizes of the channel regions and the front control gates of one of more of the FETs in order to achieve selected capacitance thereof; and
   providing the back control gates for one or more FETs in order to achieve selected conductance thereof when in an on-state;

wherein the capacitance and the conductance are selected in dependence on footprint and performance characteristics of the particular integrated circuit environment.

15. A method of driving a data-path cell of claim 1 comprising applying two or more different bias voltages to the back control gates of one or more FETs,
   wherein at least one bias voltage is selected to reduce leakage currents, and
   wherein at least one other bias voltage is selected to increase conduction currents.

16. The method of claim 15, wherein the back control gates of one or more FETs are biased to a first bias voltage when in the off-state, and wherein the back control gates of one or more FETs are biased to a different second bias voltage when in the on-state, with the at least one bias voltage selected to increase conduction currents applied to one or more FETs that provide output from the data-path cell.

17. The method of claim 14, wherein the footprint and performance characteristics of the particular integrated circuit environment include one of:
   a capacitance that is reduced by up to about 33% and conductance that is not reduced;
   an operating speed that is increased about 20% and a power consumption that is reduced about 20% in the active mode and by about one decade in the inactive mode, and wherein the footprint is reduced about 20%; and
   an operating speed that is increased between about 30 and 50%.

* * * * *